United States Patent
Singh et al.

(12) United States Patent (10) Patent No.: US 6,218,254 B1
(45) Date of Patent: Apr. 17, 2001

(54) METHOD OF FABRICATING A SELF-ALIGNED BIPOLAR JUNCTION TRANSISTOR IN SILICON CARBIDE AND RESULTING DEVICES

(75) Inventors: Ranbir Singh, Apex; Anant K. Agarwal, Chapel Hill; Sei-Hyung Ryu, Cary, all of NC (US)

(73) Assignee: Cree Research, Inc., Durham, NC (US)

( * ) Notice: Subject to any disclaimer, the term of this patent is extended or adjusted under 35 U.S.C. 154(b) by 0 days.

(21) Appl. No.: 09/401,602

(22) Filed: Sep. 22, 1999

(51) Int. Cl.$^7$ .................................................. H01L 21/331

(52) U.S. Cl. ........................ 438/364; 438/309; 438/320; 438/341; 438/369

(58) Field of Search ...................................... 438/309, 320, 438/337, 341, 342, 359, 364, 366, 369, 931

(56) References Cited

U.S. PATENT DOCUMENTS

| | | | |
|---|---|---|---|
| 4,945,394 | 7/1990 | Palmour et al. | 357/34 |
| 5,318,915 | * 6/1994 | Baliga et al. | 438/520 |
| 5,539,217 | 7/1996 | Edmond et al. | 257/77 |
| 5,726,463 | 3/1998 | Brown et al. | 257/7 |
| 5,798,277 | 8/1998 | Ryum et al. | 437/31 |
| 5,814,859 | 9/1998 | Ghezzo et al. | 257/335 |
| 6,143,593 | * 11/2000 | Augusto | 438/199 |

FOREIGN PATENT DOCUMENTS

WO 97/08754  3/1997  (WO) ............................ H01L/29/06

OTHER PUBLICATIONS

Palmour, J.W., et al., *6H–silicon carbide devices and applications*, Physica B, vol. 185, pp. 461–465 (1993).

Palmour, John W., *6H–Silicon Carbide Power Devices for Aerospace Applications*, IECEC–93, Proceedings of the 28$^{th}$ Internsocietyl Energy Conversion Engineering Conference, pp. 1.249–1.254 (Aug. 8–13, 1993).

* cited by examiner

Primary Examiner—John F. Niebling
Assistant Examiner—Christopher Lattin
(74) Attorney, Agent, or Firm—Myers Bigel Sibley & Sajovec; David C. Hall, Esq.

(57) ABSTRACT

A method of fabricating a self-aligned bipolar junction transistor in a semiconductor structure having a first layer of silicon carbide generally having a first conductivity type and a second layer of silicon carbide generally having a second conductivity type, opposite to the first conductivity type. The method comprises forming a pillar in the second silicon carbide layer, the pillar having a side wall and defining an adjacent horizontal surface on the second layer, forming a dielectric layer having a predetermined thickness on the second semiconductor layer, including the side wall and the horizontal surface. After formation of the dielectric layer, the dielectric layer on a portion of the horizontal surface adjacent the side wall is anisotropically etched while at least a portion of the dielectric layer remains on the side wall, thereby exposing a portion of the horizontal surface. A portion of the second layer below the exposed portion of the horizontal surface is then doped with a dopant of the first conductivity type to create a doped well region in the second layer which is spaced from the side wall by a distance defined by the thickness of the dielectric layer. Resulting devices are likewise disclosed.

20 Claims, 8 Drawing Sheets

METHOD OF FABRICATING A SELF-ALIGNED BIPOLAR JUNCTION TRANSISTOR IN SILICON CARBIDE AND RESULTING DEVICES

BACKGROUND

1. Field of the Invention

The present invention relates to a method of fabricating a bipolar junction transistor in silicon carbide, and in particular relates to a method of fabricating a bipolar junction transistor in silicon carbide wherein the base and emitter contacts are self-aligned, and devices resulting therefrom.

2. Description of the Related Art

The bipolar junction transistor (BJT) is a well-known and frequently used semiconductor electronic device. A bipolar junction transistor is generally defined as a device formed of a semiconductor material having two opposing p-n junctions in close proximity to one another. Because of their respective structures and conductivity types, bipolar junction transistors are generally referred to as n-p-n or p-n-p transistors.

In the operation of an n-p-n BJT, current carriers enters a region of the semiconductor material adjacent one of the p-n junctions which is called the emitter. Most of the charge carriers exit the device from a region of the semiconductor material adjacent the other p-n junction which is called the collector. The collector and emitter have the same conductivity type, either p or n. A small portion of semiconductor material known as the base, having the opposite conductivity type (either p or n) from the collector and the emitter, is positioned between the collector and the emitter. The BJT's two p-n junctions are formed where the collector meets the base and where the base meets the emitter.

When current is injected into or extracted from the base, depending upon whether the BJT is n-p-n or p-n-p, the flow of charge carriers (i.e. electrons or holes) which can move from the collector to the emitter is greatly affected. Typically, small currents applied to the base can control proportionally larger currents passing through the BJT, giving it its usefulness as a component of electronic circuits. The structure and operation of BJTs are described in detail in B. Streetman, SOLID STATE ELECTRONIC DEVICES, 2d ed. (1980), chapter 7.

One of the requirements for an operable and useful bipolar junction transistor is an appropriate semiconductor material from which it can be formed. The most commonly used semiconductor material is silicon (Si), although attention has been given to other semiconductor materials such as gallium arsenide (GaAs) and indium phosphide (InP). For given circumstances and operations, these materials all have appropriate applications.

Another candidate material for bipolar junction transistors is silicon carbide (SiC). Silicon carbide has well-known advantageous semiconductor characteristics: a wide bandgap, a high electric field breakdown strength, a reasonably high electron mobility, a high thermal conductivity, a high melting point, and a high saturated electron drift velocity. Taken together, these qualities mean that, as compared to devices formed in other semiconductor materials, electronic devices formed in silicon carbide have the capability of operating at higher temperatures, at high power densities, at high speeds, at high power levels and even under high radiation densities.

Due to their ability to function at high frequencies, high temperatures, and high power levels, silicon carbide transistors are highly desirable for use in applications such as high power radio frequency transmitters for radar and communications, for high power switching applications, and for high temperature operations such as jet engine control. Accordingly, methods of producing device quality silicon carbide and devices formed from silicon carbide have been of interest to scientists and engineers for several decades.

Silicon carbide crystallizes in over 150 different polytypes, or crystal structures, of which the most common are designated 3C, 4H and 6H where "C" stands for "cubic" and "H" for "hexagonal." At the present time, the 6H polytype is the most thoroughly characterized, but the 4H polytype is more attractive for power devices because of its higher electron mobility.

At present time, silicon carbide is a difficult material to fabricate devices with. Silicon carbide's high melting point renders techniques such as alloying and diffusion of dopants more difficult, usually because a number of the other materials necessary to perform such operations tend to break down at the high temperatures required to affect silicon carbide. Silicon carbide is also an extremely hard material, and indeed its most common use is as an abrasive. Attempts have been made with some success in manufacturing junctions, diodes, transistors and other devices from silicon carbide. One example of a bipolar junction transistor is disclosed in Palmour et al., U.S. Pat. No. 4,945,394, which is incorporated herein by reference in its entirety. Palmour et al. disclose a bipolar junction transistor formed in silicon carbide wherein the base and emitter are formed as wells using high temperature ion implantation. However, since the emitter and base regions are formed using photolithographic techniques, the precision with which the base and emitter regions may be spaced is limited; typically the spacing must be about 1–5 $\mu$m or more using conventional lithographic techniques (with about 2 $\mu$m being most typical), which may result in undesirably high base resistance, and also in unwanted base-collector capacitance, both of which reduce the ability of the device to operate at high frequencies. Moreover, since bipolar devices in silicon carbide exhibit relatively short minority carrier lifetimes, typically 40 nsec-3 sec, it is imperative that the physical dimensions of such devices be tightly controlled.

Self alignment techniques, i.e. manufacturing techniques through which device features automatically and inherently align as a result of the manufacturing process, have been used to produce silicon carbide MOSFETs. For example, U.S. Pat. No. 5,726,463, which is incorporated herein by reference in its entirety, discloses a silicon carbide MOSFET having a self-aligned gate structure in which self-alignment of the gate contacts is achieved by filling steep-walled grooves with conductive gate material over a thin oxide layer, and applying contacts to the gate material through windows opened in a dielectric layer. Such techniques are designed to reduce stray capacitance by reducing the overlap of the gate contacts with the drain and source regions, and are thus not applicable to the fabrication of bipolar junction transistors.

Accordingly, there is a need in the art for a method of fabricating a bipolar junction transistor in silicon carbide which enables precise and close spacing of the base and emitter contacts.

OBJECTS AND SUMMARY OF THE INVENTION

It is an object of the present invention to enable precise and close spacing of the base and emitter contacts in a bipolar junction transistor formed in silicon carbide.

It is a further object of the present invention to simplify the process of fabricating a bipolar junction transistor in silicon carbide.

A still further object of the invention is to reduce the number of photolithographic steps required to fabricate a bipolar junction transistor in silicon carbide.

According to the present invention, the foregoing and other objects are attained by a method of fabricating a self-aligned bipolar junction transistor in a semiconductor structure having a first layer of silicon carbide generally having a first conductivity type and a second layer of silicon carbide generally having a second conductivity type, opposite to the first conductivity type.

The method comprises forming a trench in the second silicon carbide layer, the trench having a bottom wall and opposing side walls, forming an oxide spacer layer having a predetermined thickness on the second semiconductor layer, including the bottom wall and side walls of the trench. After formation of the oxide spacer layer, the oxide spacer layer on a portion of the bottom wall of the trench between the side walls is anisotropically etched while at least a portion of the oxide spacer layer remains on the side walls, thereby exposing a portion of the bottom wall of the trench. A portion of the second layer below the exposed portion of the bottom wall is then doped with a dopant of the first conductivity type to create a doped well region in the second layer. The oxide spacer layer may then be removed. This method of fabrication is particularly attractive because the sidewall oxide (dielectric) thickness can be accurately controlled using CVD techniques. The thickness of this conformally deposited dielectric determines the emitter-base spacing, which is instrumental in increasing the frequency of operation of the device.

In accordance with another aspect of the invention, a self-aligned bipolar junction transistor may be manufactured using a semiconductor structure having a first layer of silicon carbide generally having a first conductivity type and a second layer of silicon carbide generally having a second conductivity type, opposite to the first conductivity type and epitaxially deposited on the first layer. In this aspect, the invention comprises etching the second silicon carbide layer to form at least one pillar having a top wall and opposing side walls, and a horizontal surface adjacent thereto, forming an oxide spacer layer having a predetermined thickness on the structure, including the top wall and side walls of the pillar and the horizontal surface adjacent the pillar; anisotropically etching the dielectric spacer layer from the horizontal surfaces adjacent the pillar while a portion of the oxide spacer layer remains on the side walls of the pillar, thereby exposing the horizontal surface; doping a portion of the first layer below the exposed portion of the horizontal surface using a dopant of the first conductivity type to create a doped well region in the first layer; and removing the oxide spacer layer.

In another aspect, the invention includes a bipolar junction transistor fabricated in silicon carbide and comprising a substrate having a first conductivity type, having a first surface and a second surface opposite the first surface and forming a collector of the transistor; an epitaxial layer of silicon carbide formed on the substrate, having a second conductivity type, and forming a base of the transistor; a pillar having a top wall and opposing side walls formed above the epitaxial layer, the pillar forming a base or emitter region of the transistor; a doped well region in the epitaxial layer adjacent the pillar spaced a distance from the pillar defined by a thickness of an oxide spacer layer formed on one of the opposing sidewalls and removed after formation of the doped well region, wherein the doped well region has the first conductivity type and forms an emitter or base region of the transistor.

DETAILED DESCRIPTION

The present invention is directed to a method of fabricating a bipolar junction transistor in silicon carbide. As discussed above, silicon carbide is a difficult material to work with because of its high melting point and the difficulty of growing large, device quality single crystals. However, the characteristics of silicon carbide (i.e. wide bandgap, high thermal conductivity, high melting point, high electric field breakdown strength, low dielectric constant, and high saturated electron drift velocity) make it an ideal material for fabricating electronic devices for use in high-temperature, high frequency applications in products ranging from cellular base stations to jet aircraft engines.

As discussed above, a bipolar junction transistor (BJT) is an active, three terminal semiconductor device comprising two p-n junctions in close proximity. BJTs are broadly characterized as n-p-n or p-n-p depending on the conductivity types of their respective bases, collectors and emitters. For simplicity, only the manufacture of an n-p-n BJT will be described in detail. However, it will be immediately realized by those having skill in the art that the same method could be used to manufacture a p-n-p transistor by reversing the described conductivity types.

The method of the present invention introduces a novel self-alignment technique for aligning the base and emitter contacts of a bipolar junction transistor formed in silicon carbide. The method of the present invention may be implemented using as a starting structure a silicon carbide substrate on which there is deposited one or more epitaxial layers of silicon carbide. Epitaxial layers of silicon carbide may be applied as described in U.S. Pat. Nos. 5,011,549 and 4,912,064 to Kong, et al., the disclosures of which are incorporated herein by reference.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. Furthermore, the various layers and regions illustrated in the figures are illustrated schematically. As will also be appreciated by those of skill in the art, references herein to a layer formed "on" a substrate or other layer may refer to the layer formed directly on the substrate or other layer or on an intervening layer or layers formed on the substrate or other layer. As will also be appreciated by those having skill in the art, while the present invention is described with respect to layers, such layers may be formed epitaxially, by ion implantation, or by other suitable means. The present invention is not limited to the relative size and spacing illustrated in the accompanying figures.

Figure 1:
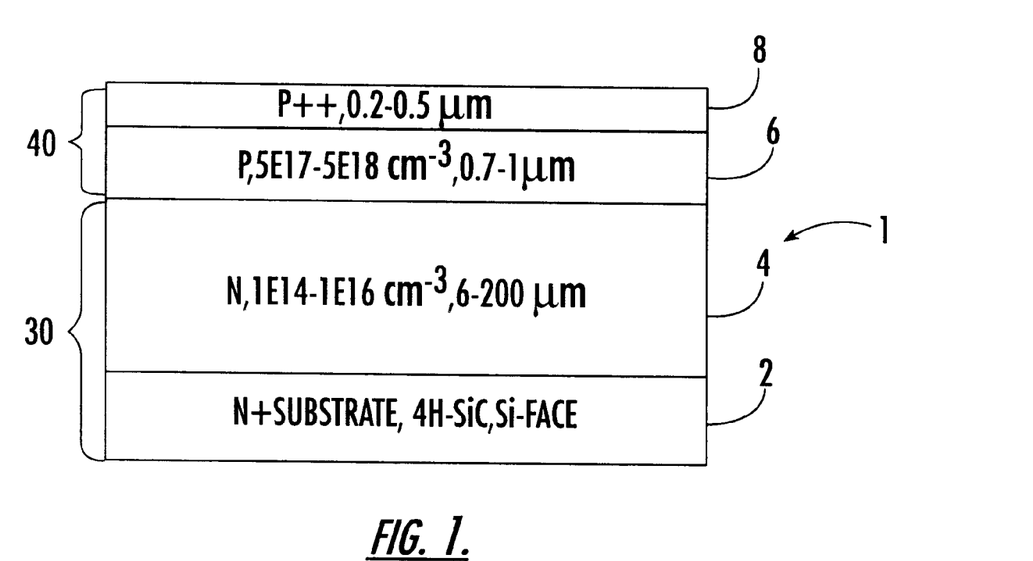
FIG. 1 depicts, in cross section, a semiconductor structure comprising a silicon carbide substrate having a plurality of epitaxial layers deposited thereon.

Accordingly, FIG. 1 depicts a semiconductor structure 1 comprising a heavily doped silicon carbide substrate 2 (with conductivity designated as n+). Although substrate 2 may be formed from any of a number of different silicon carbide polytypes (i.e. crystal structures), substrate 2 preferably comprises a single crystal 4H alpha-SiC material (Si-face). To obtain n-type material, substrate 2 may be doped during the growth phase with a donor dopant such as nitrogen.

A first epitaxial layer 4 having the same conductivity type as substrate 2 is disposed on substrate 2. Layer 4 is doped with a donor dopant such as nitrogen at a concentration of between about $1E14$ cm$^{-3}$ and $1E16$ cm$^{-3}$. Preferably, doping is performed during the epitaxial growth process. Layer 4 has a thickness of approximately 3 µm to approximately 200 µm, and most preferably from about 6 µm to about 20 µm. Together, substrate 2 and layer 4 form the collector region of the transistor under fabrication.

A second epitaxial layer 6 having a conductivity type opposite that of substrate 2 and layer 4 is formed on layer 4. Layer 6 is doped with an acceptor dopant such as boron or aluminum at a concentration of about $5E17$ to $5E18$ cm$^{-3}$. Layer 6 has a thickness of approximately 0.3 µm to approximately 5 µm, and most preferably from about 0.7 µm to about 1 µm. Finally, epitaxial layer 8, having a conductivity type the same as layer 6, is formed on layer 6. Layer 8 is a heavily doped layer having a thickness of approximately 0.05 µm to approximately 2 µm, and most preferably from about 0.2 µm to about 0.5 µm. Layer 8 is doped with an acceptor dopant such as boron or aluminum at a concentration above $1E18$ cm$^{-3}$ and preferably of about $1E20$ cm$^{-3}$ to $1E21$ cm$^{-3}$. Layers 6 and 8 form the base region of the transistor under fabrication.

As used herein, the descriptive phrase "opposite conductivity type" merely refers to whether a given region of semiconductor material demonstrates opposite n-type or p-type conductivity in comparison with another region of material, without regard to the doping concentration of either sample of material. Thus, for example, n+ material and p-type material have opposite conductivity types, while p+ material and p-type material are considered to have the same conductivity types, albeit with different doping concentrations.

Figure 2:
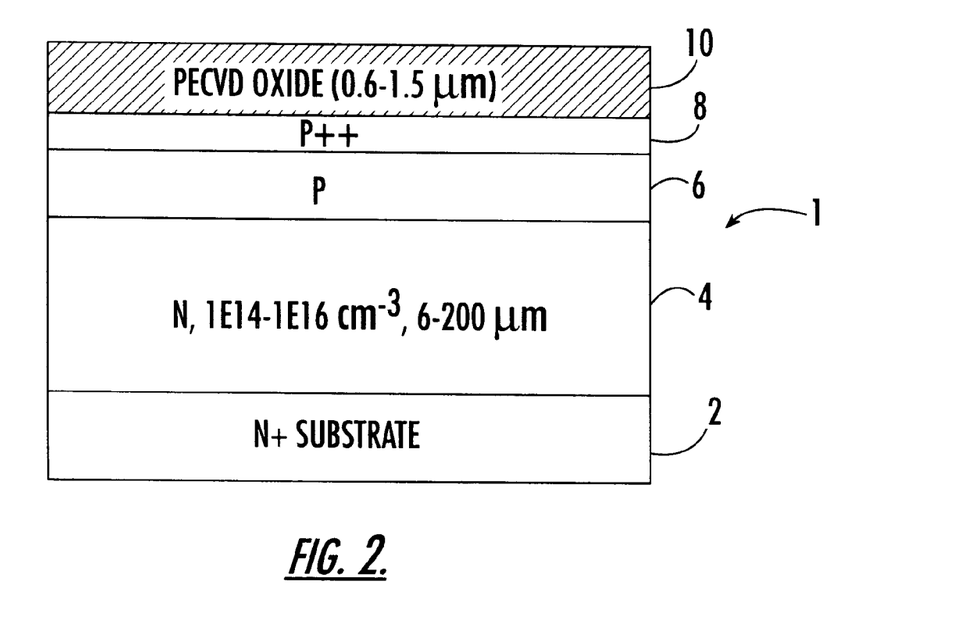
FIG. 2 is a cross section of the semiconductor structure depicted in FIG. 1 on which a layer of oxide has been deposited.

Referring to FIG. 2, a dielectric layer 10, preferably silicon dioxide, is formed on the exposed surface of layer 8, preferably using the Chemical Vapor Deposition (CVD) process. An example of the CVD process is the Plasma Enhanced CVD (PECVD) growth technique. The PECVD process is described in Chapter 6 of S. M. Sze, VLSI TECHNOLOGY, 2nd Ed., McGraw-Hill 1988. Methods of forming high quality silicon dioxide layers on silicon carbide are described in U.S. Pat. No. 5,459,107.

Oxide layer 10 preferably has a thickness between 0.2 and 3 µm, and most preferably has a thickness between 0.6 and 1.5 µm.

Figure 3:
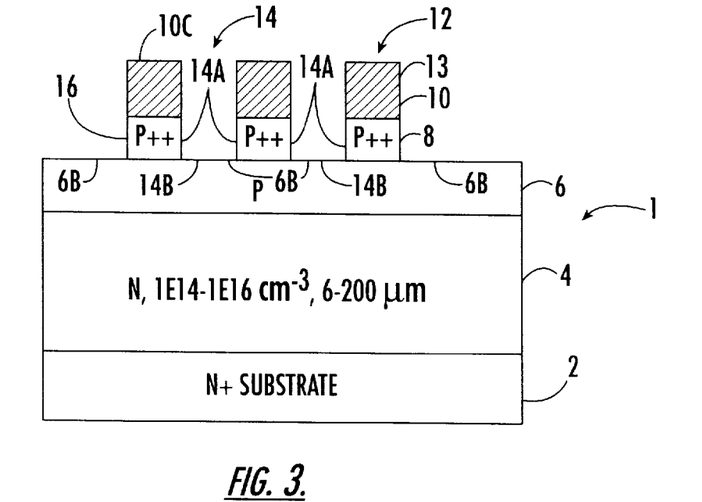
FIG. 3 is a cross section of the semiconductor structure depicted in FIG. 2 which has been etched to form a series of pillars.

Next, oxide layer 10 is patterned using an etch mask in accordance with conventional photolithographic techniques, and portions of the oxide layer 10 and layer 8 are etched away to form pillars 12, shown in cross section in FIG. 3. Each pillar 12 comprises a raised portion 16 formed from layer 8 and a cap portion 13 formed from oxide layer 10. The etching process is stopped once layer 8 is etched completely down to the surface 6B of layer 6 (thereby exposing the surface 6B of layer 6). Pillars 12 define trenches 14 having bottom walls 14B along the surface 6B of layer 6 and side walls 14A. Raised portions 16 will ultimately form the base region in the completed BJT device.

Figure 3A:
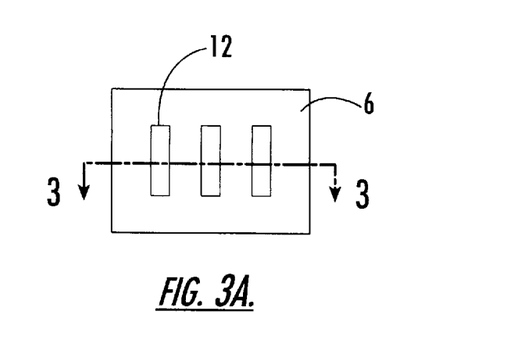
FIG. 3A is a plan view of a semiconductor structure fabricated in accordance with the present invention.

FIG. 3A is a top view of one embodiment of the structure shown in FIG. 3. As is apparent from FIG. 3A, pillars 12 actually may have a linear structure. Other configurations, such as circular configurations, are possible and will be appreciated by those having skill in the art as being within the scope of the present invention.

Figure 4:
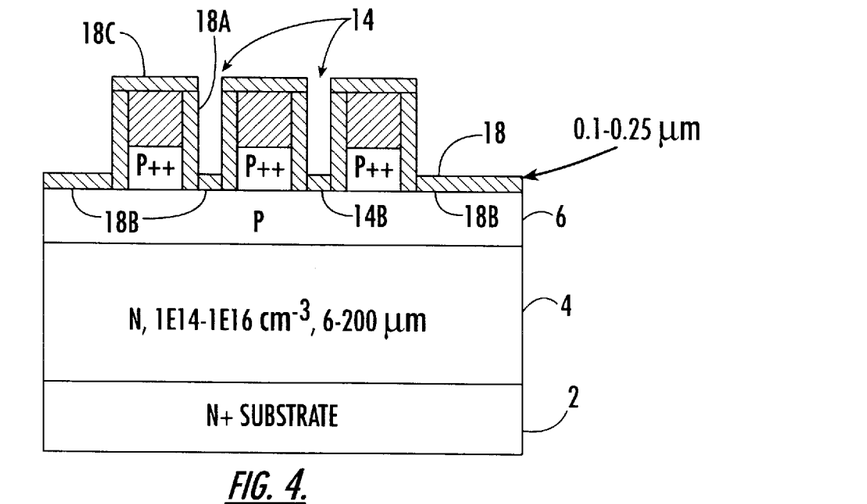
FIG. 4 is a cross section of the semiconductor structure depicted in FIG. 3 on which a second layer of oxide has been deposited.

Referring now to FIG. 4, an oxide spacer layer 18 is formed across the top surface of structure 1 including side walls 14A of trenches 14, preferably using the PECVD process. Oxide spacer layer 18 preferably has a thickness of between about 0.05 µm and 0.5 µm, and most preferably has a thickness of about 0.1–0.25 µm. As will be apparent from the discussion below, the thickness of oxide spacer layer 18 will determine the spacing of the base and collector contacts of the bipolar junction transistor manufactured according to the present invention. The thickness of oxide spacer layer 18 is determined by the amount of time the layer is deposited. Typical deposition rates vary from machine to machine. In general, however, the thickness of oxide spacer layer 18 may be carefully controlled to better than +/−0.1 µm. The thickness of the layer as deposited may be confirmed through measurement with an ellipsometer.

Oxide spacer layer 18 includes portions 18C disposed on an exposed surface of pillars 12 substantially parallel to the exposed surface 6B of layer 6, portions 18A disposed on the side walls of pillars 12, and portions 18B disposed on the exposed surface 6B of layer 6, including bottom walls 14B of trenches 14.

Although layer 18 is described in reference to the preferred embodiments as an oxide layer, it will be understood that layer 18 may be formed of any material that is may be controllably deposited on a layer of silicon carbide and which is suitably susceptible to anisotropic etching such that it will permit the alignment and formation of adjacent well regions as described more fully hereinafter.

Figure 5:
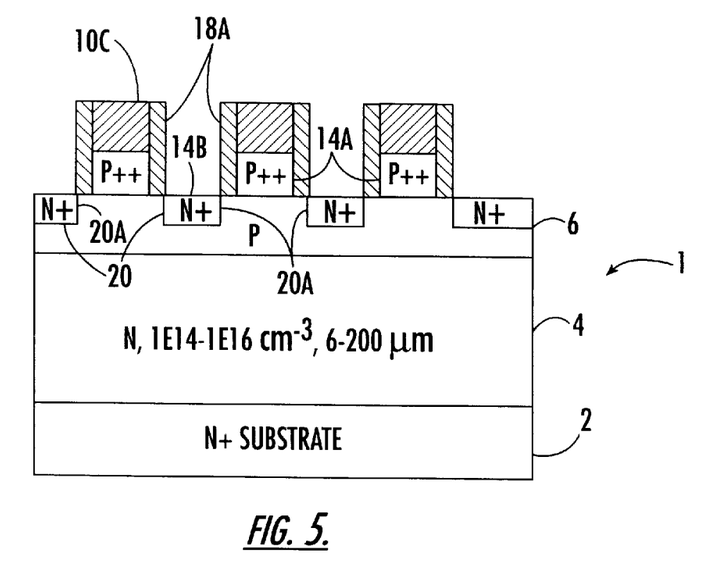
FIG. 5 depicts the semiconductor structure shown in FIG. 4 after an anisotropic etch has removed the horizontal oxide surfaces, and well regions have been implanted.

As illustrated in FIG. 5, an anisotropic etch is next performed to remove portions of the oxide spacer layer 18. As is familiar to those skilled in the art, an anisotropic process is one which affects a material along certain axes or planes and not others. Thus, an anisotropic etch may remove material along one surface more efficiently than another surface. For example, as illustrated in FIG. 5, an anisotropic etch may remove material from a horizontal surface and not a vertical surface of a structure.

As seen in FIG. 5, following the anisotropic etch, the horizontal portions 18B and 18C of the oxide spacer layer 18 have been removed to expose layers 10C of the pillars 12 and the surface 6B of layer 6 including bottom walls 14B of trenches 14, while the vertical portions 18A of the oxide spacer layer 18 disposed on the side walls of pillars 12 remain substantially intact.

Next, heavily doped well regions 20 of n-type conductivity, which will ultimately form the emitter in the completed device, are formed in layer 6. Such well regions may be formed using high temperature ion implantation techniques described in U.S. Pat. Nos. 4,945,394 and 5,087,576. Ion implantation is typically necessary since thermal diffusion is impractical in silicon carbide, as dopant diffusion rates are too small. Using ion implantation, silicon carbide can be implanted with impurities to a concentration of 1E18 to 1E21 cm$^{-3}$. In preferred embodiments, the implantation is conducted with the wafer at an elevated temperature, and the implants are activated at 1200 to 1700 C. in a suitable ambient.

Well regions 20 extend preferably between about 0.25 $\mu$m and 1 $\mu$m deep into layer 6, and are most preferably about 0.3–0.6 $\mu$m deep. In the embodiment illustrated in FIG. 5, well regions 20 do not extend all the way through layer 6 into layer 4. Well regions 20 preferably have a doping density from about 1E18 cm$^{-3}$ to about 1E21 cm$^{-3}$, with a range of 1E20–1E21 cm$^{-3}$ being most preferable.

Because the side wall portions 18A of the oxide spacer layer 18 are present during creation of the well regions 20, the edges 20A of well regions 20 are spaced from the side walls 16A of raised portions 16 by a distance equal to the thickness of the oxide spacer layer 18. Thus, the spacing of the base contacts and the emitter contacts is determined by oxide thickness, and not by lithography, permitting much closer alignment of the base and emitter contacts. Spacing of 0.1–0.25 $\mu$m can be achieved using the method of the present invention, whereas a spacing of at least 1 $\mu$m is required using conventional lithography techniques. The improved spacing achieved with the method of the present invention reduces base resistance and base collector capacitance, and enables the production of devices which operate at higher frequencies.

Figure 6:
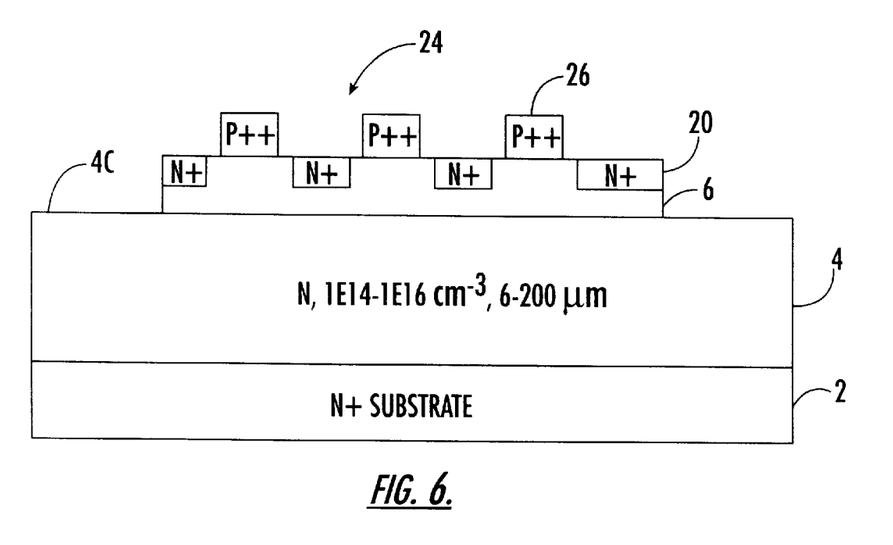
FIG. 6 depicts the semiconductor structure shown in FIG. 5 following removal of the remaining oxide surfaces and isolation of the mesa in which a bipolar junction transistor is fabricated.

Referring now to FIG. 6, the remaining oxide layers 18A and 10 are stripped using conventional wet etching techniques. Next, the periphery of layer 6 is etched away by reactive ion etching to form a mesa 24 comprising layer 6, well regions 20, and raised portions 16. Mesa isolation is performed in order to isolate the base-collector junction and to isolate devices fabricated on the same substrate.

Figure 7:
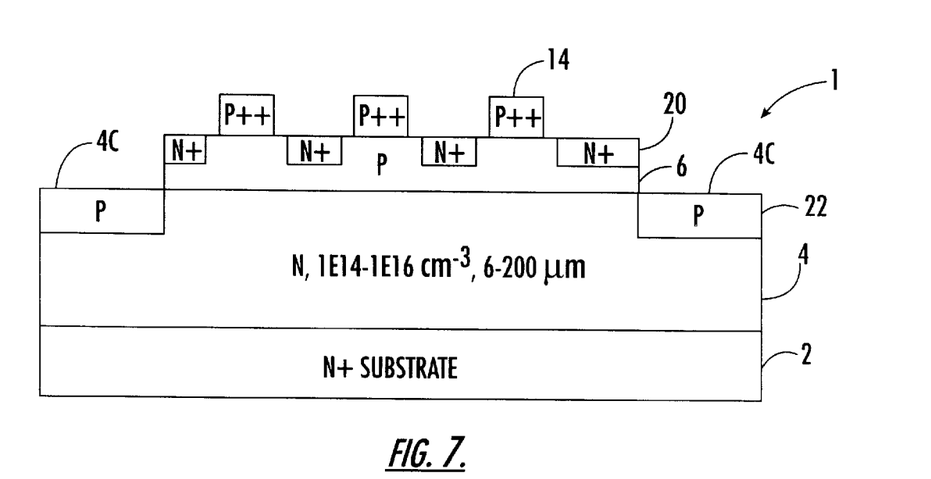
FIG. 7 is a cross section of the structure depicted in FIG. 6 following JTE implantation.

Following these steps, peripheral surface 4C of layer 4 is exposed. As illustrated in FIG. 7, junction termination extension (JTE) implantation is next performed to create p-type regions 22 beneath the exposed peripheral surface 4C of layer 4. The p-type regions 22 serve to spread the depletion region of the transistor in a controlled manner.

The entire structure 1 is then annealed to activate implanted dopant atoms. The anneal temperature is preferably between about 1200C and 1800C. The device may be annealed for a time period ranging from one minute to eighteen hours, and preferably from three minutes to fourteen minutes.

Figure 8:
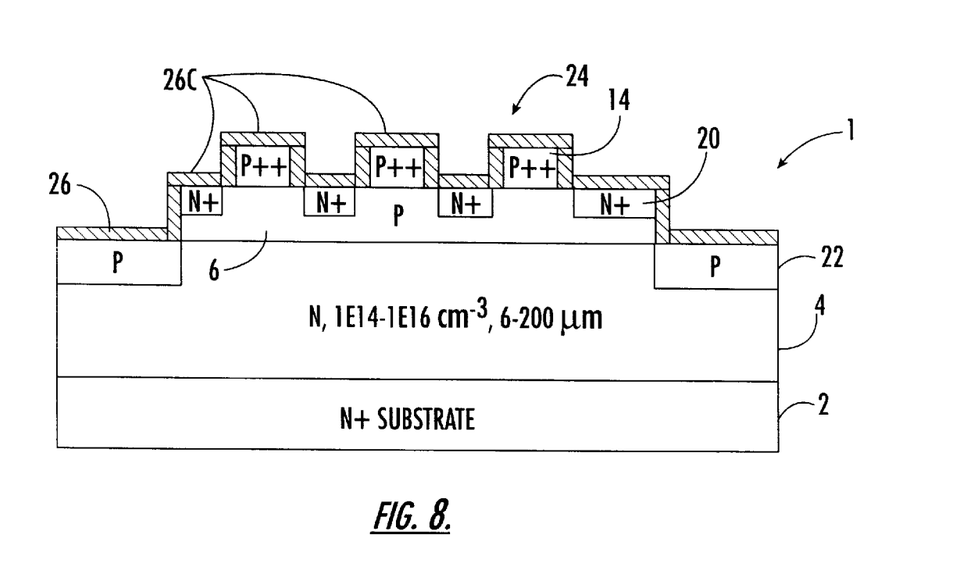
FIG. 8 depicts the structure shown in FIG. 7 after deposition of another oxide layer.
Figure 9:
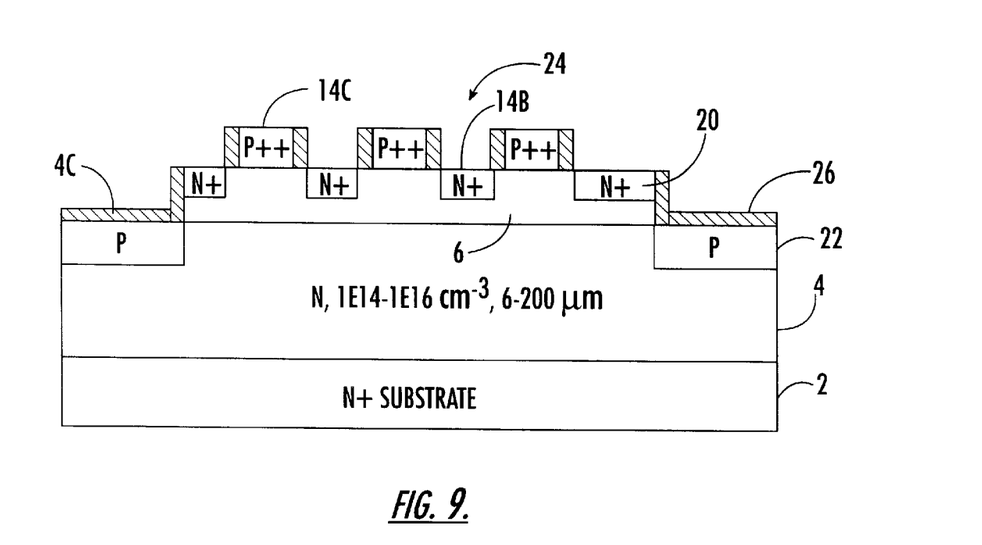
FIG. 9 depicts the structure shown in FIG. 8 after removal of the horizontal oxide surfaces with an anisotropic etch.
Figure 10:
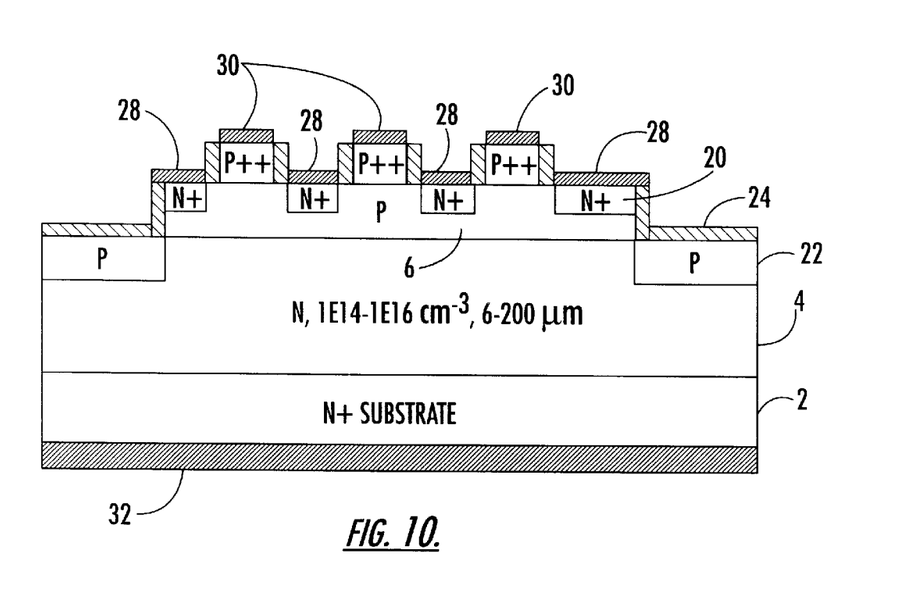
FIG. 10 is a cross section of a completed device including ohmic contacts to the collector, emitter and base regions of the transistor.

Having described the fabrication of the basic structure of a bipolar junction transistor, formation of ohmic contacts on the device will now be described with reference to FIGS. 8–10. First, a PECVD oxide layer 26 is formed along the top surface of the structure I (FIG. 8) followed by an anisotropic etch to remove the horizontal portions 26C of the oxide layer 26 from mesa 24, but not from peripheral surface 4C (FIG. 9). Following the anisotropic etch, surfaces 14C of raised portions 14 are exposed, as are surfaces 14B of well regions 20. Finally, emitter contacts 28 are applied to the surfaces 14B of well regions 20 and base contacts 30 are applied to the surfaces 14C of raised portions 14.

A number of metals and metal composites are appropriate for these ohmic contacts. For example, nickel or nickel-titanium combinations are appropriate ohmic contacts to n-type silicon carbide while aluminum or aluminum-titanium combinations are useful ohmic contacts to p-type silicon carbide. In addition, cobalt silicide ($CoSi_2$) has shown promise as an ohmic contact material to p-type silicon carbide. Appropriate ohmic contact structures are described in U.S. Pat. Nos. 5,323,022 and 5,409,859. The contacts 28, 30, 32 are high temperature annealed in a conventional manner to create ohmic contacts, and a wet etch is performed to remove unreacted metal.

Figure 14:
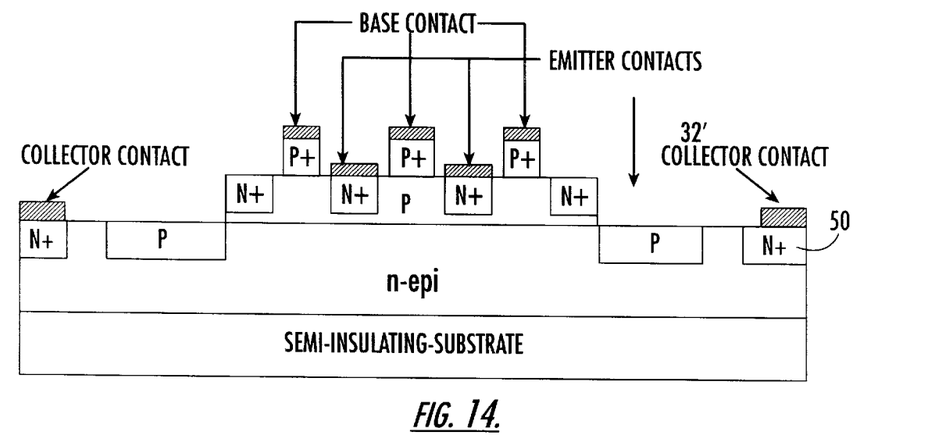
FIG. 14 depicts an embodiment of the present invention wherein the substrate is semi-insulating.

Since the substrate 2 in the embodiment illustrated in FIGS. 1–10 is conductive, a collector contact 32 is applied to the bottom surface of substrate 2. However, it will be readily understood by those skilled in the art that the present invention could be implemented using a non-conducting substrate such as semi-insulating silicon carbide or sapphire ($Al_2O_3$), in which case the collector contact 32 would not be applied to the bottom surface of substrate 2, but rather would be applied to another surface of layer 4 as illustrated, for example, in FIG. 14. In that case, n+ region 50 should have a thickness of from about 1–20 $\mu$m (preferably about 1–5 $\mu$m) and is preferably doped at a concentration of about 1E18 cm$^{-3}$. Such an embodiment is expected to have a lower pad capacitance and therefore a better high frequency performance.

Figure 11:
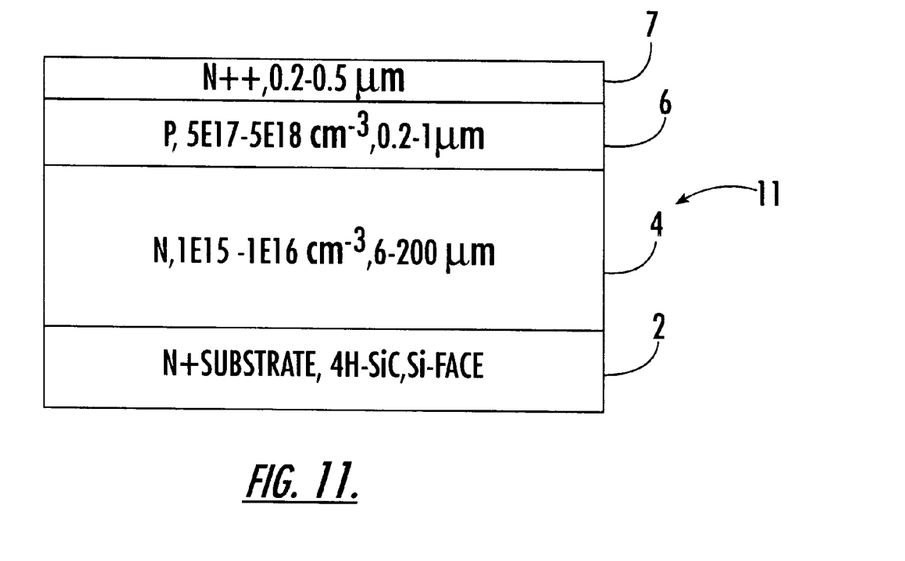
FIG. 11 is a cross section of a second semiconductor structure comprising a silicon carbide substrate having a plurality of epitaxial layers deposited thereon.
Figure 12:
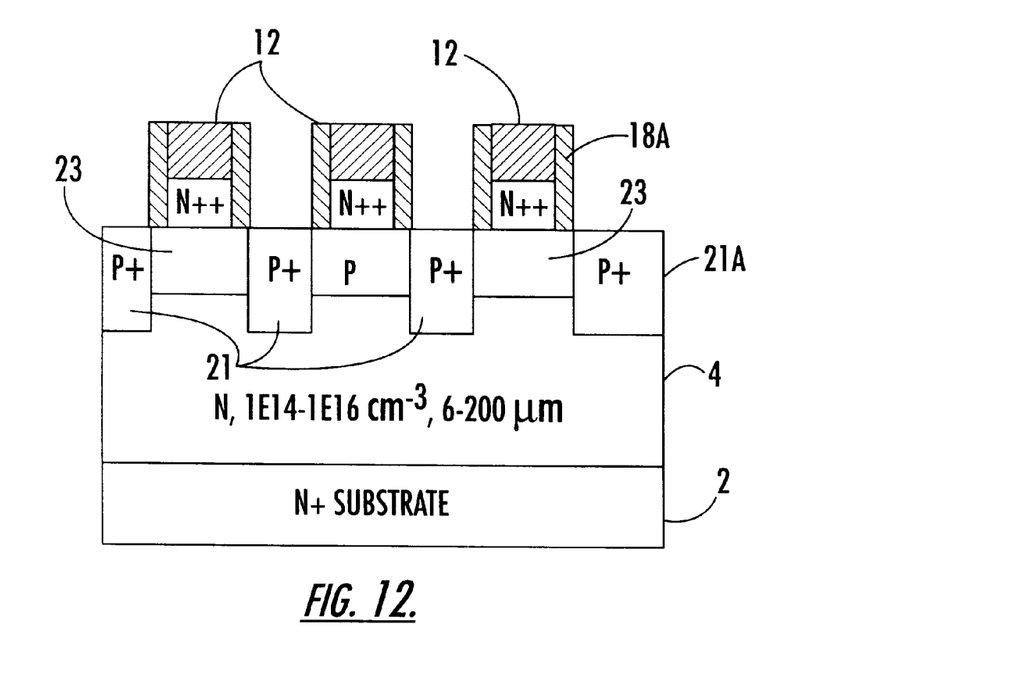
FIG. 12 depicts the semiconductor structure shown in FIG. 11 following formation of pillars and implantation of well regions.
Figure 13:
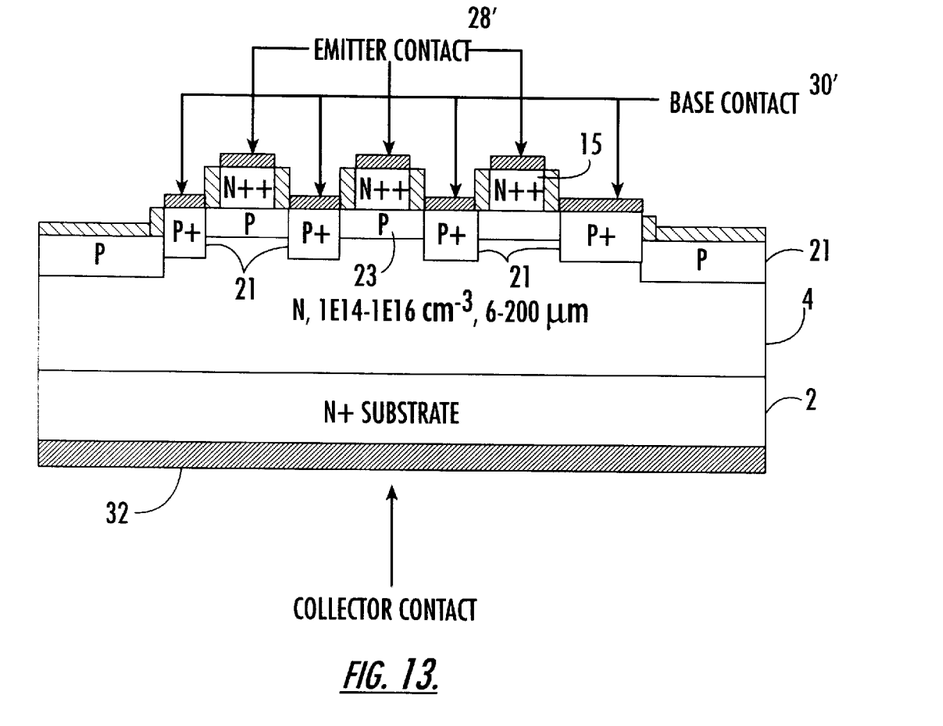
FIG. 13 is a cross section of a completed device formed using the structure depicted in FIG. 11.

Another embodiment of the present invention is illustrated in FIGS. 11–13 in which the epitaxial structure 11 shown in FIG. 11 is used as the starting structure. As shown in FIG. 11, structure 11 includes a heavily doped n-type substrate 2 of 4H silicon carbide on which is deposited an n-type epitaxial layer 4, also of silicon carbide. As with the structure shown in FIG. 1, substrate 2 and layer 4 form the collector of the bipolar transistor, and a p-type epitaxial layer 6 is formed on layer 4. Unlike the structure shown in FIG. 1, however, a heavily doped epitaxial layer 7 of n-type conductivity is deposited on layer 6. Layer 7 is doped with a donor dopant such as nitrogen at a concentration of about 1E18 to 1E21 cm$^{-3}$. Layer 7 has a thickness of approximately 0.05 $\mu$m to approximately 2 $\mu$m, and most preferably from about 0.2 $\mu$m to about 0.5 $\mu$m.

The steps for processing structure 10 are similar to that described above with respect to FIGS. 1–4, i.e., the structure is coated with an oxide mask which is etched away to form pillars 12 including raised portions 15 formed out of the top epitaxial layer (in this case layer 7), after which oxide layer 18 is formed over the top surface of the structure 10 by, for example, PECVD.

Following an anisotropic etch of the oxide layer 18, and as illustrated in FIG. 12, heavily doped well regions 21 are formed in the structure such that the edges of well regions 21 are spaced a distance from the pillars 12 approximately equal to the thickness of the oxide layer 18. In the embodiment illustrated in FIGS. 11–13, however, the well regions 21 are doped to have a p-type conductivity. In one embodiment, well regions 21 extend through layer 6 and partially into layer 4. Consequently, well regions 21, together with the p-type regions 23 from layer 6, form the base of the transistor.

The remainder of the processing is similar to that described with respect to FIGS. 6–10, except that as shown in FIG. 13, the emitter contacts are formed on exposed surfaces of raised portions 15, while the base contacts are made to the top surfaces of well regions 21.

Figure 15:
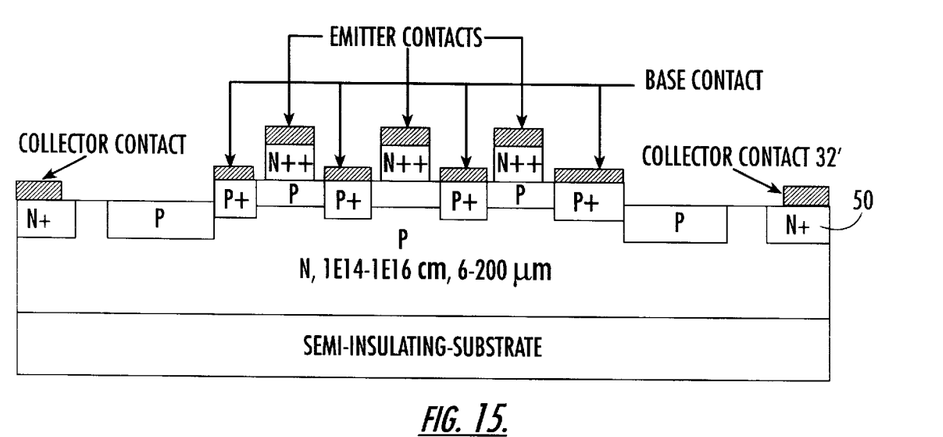
FIG. 15 depicts a second embodiment of the present invention wherein the substrate is semi-insulating.

As illustrated in FIG. 15, the embodiment described in FIGS. 11–13 may be implemented using a non-conductive or semi-insulating substrate, in which case collector contacts 32' to the n-type layer 4 may be made on the top surface of the device over n+ well regions 50 formed in layer 4.

A preferred technique for performing the etching steps described above comprises reactive ion etching with nitrogen trifluoride ($NF_3$). Nitrogen trifluoride has demonstrated a number of advantages in silicon carbide etching processes. A more complete discussion of reactive ion etching using $NF_3$ is provided Palmour et al., Surface Characteristics of Monocrystalline Beta-SiC Dry Etched in Fluorinated Gases, Mat. Res. Soc. Symp. Proc., Vol. 76, 1987, p. 185., the techniques of which are incorporated herein by reference. Appropriate techniques for etching silicon carbide are also described in U.S. Pat. Nos. 4,865,685 and 4,981,551.

The invention which has been set forth is a method of fabricating a bipolar junction transistor (BJT) in silicon carbide (all polytypes) as opposed to silicon, gallium arsenide, or other semiconductor materials. The disclosed embodiments align the base and emitter contacts of the transistor by means of oxide formation rather than lithographic techniques, permitting closer and more precise positioning of the base and emitter contacts with respect to one another. Because silicon carbide is a wide bandgap semiconductor that has the ability to operate at much higher temperatures than other common semiconductors, transistors fabricated according to the present invention likewise demonstrate superior operating characteristics at high temperatures. Moreover, transistors fabricated according to the present invention also have the ability to operate at higher power levels and higher frequencies. The inventive method can be used to fabricate either n-p-n or p-n-p transistors.

In the specification and drawings, there have been set forth preferred and exemplary embodiments of the invention which have been included by way of example and not by way of limitation, the scope of the invention being set forth in the accompanying claims.

We claim:

1. A method of fabricating a self-aligned bipolar junction transistor in a semiconductor structure having a first layer of silicon carbide and a second layer of silicon carbide, the method comprising:

forming a trench in the second silicon carbide layer, the trench having a bottom wall and opposing side walls;

conformally depositing a spacer layer having a predetermined thickness on the second semiconductor layer, including the bottom wall and side walls of the trench;

anisotropically etching the spacer layer from a portion of the bottom wall of the trench between the side walls, thereby exposing a portion of the bottom wall of the trench while at least a portion of the spacer layer remains on the side walls;

doping a region below the exposed portion of the bottom wall with a dopant to create a doped well region below the bottom wall; and removing the spacer layer.

2. The method of claim 1, wherein the second layer comprises a base region, the well region comprises an emitter region, and the first layer comprises a collector region of the bipolar junction transistor.

3. The method of claim 1, wherein the second layer comprises an emitter region, the well region comprises a base region, and the first layer comprises a collector region of the bipolar junction transistor.

4. The method of claim 1, wherein the step of forming a trench in the second silicon carbide layer comprises etching a portion of the second layer.

5. The method of claim 1, wherein the step of doping a region below the exposed portion of the bottom wall comprises high temperature ion implantation.

6. The method of claim 1, further comprising:

etching a portion of the second layer to form a mesa containing the transistor.

7. The method of claim 6, wherein the step of etching a portion of the second layer is followed by the steps of:

forming a dielectric layer on the mesa, and anisotropically etching the dielectric layer to reveal contact surfaces.

8. The method of claim 2 or 3, further comprising:

providing ohmic contacts to the base, emitter and collector regions.

9. The method of claim 1, wherein the second layer comprises a layer of heavily doped, p-type silicon carbide.

10. A method of fabricating a self-aligned bipolar junction transistor in a semiconductor structure having a first layer of silicon carbide of a first conductivity type and a second layer of silicon carbide of a second conductivity type, opposite to the first conductivity type and epitaxially deposited on the first layer, the method comprising:

etching the second layer of silicon carbide to form at least one pillar having a first surface opposite the first silicon carbide layer and opposing side walls, and a horizontal surface adjacent the pillar;

forming a spacer layer having a predetermined thickness on the first surface of the pillar, the opposing side walls and the horizontal surface adjacent the pillar;

anisotropically etching the spacer layer from the horizontal surfaces adjacent the pillar while at least a portion of the spacer layer remains on the side walls of the pillar, thereby exposing the horizontal surface;

doping a portion of the second layer of silicon carbide below the exposed portion of the horizontal surface with a dopant of the first conductivity type to create a doped well region in the second layer of silicon carbide; and removing the spacer layer.

11. The method of claim 10, wherein the second layer comprises a base region, the well region comprises an emitter region, and the first layer comprises a collector region of the bipolar junction transistor.

12. The method of claim 10, wherein the second layer of silicon carbide comprises an emitter region, the well region comprises a base region, and the first layer of silicon carbide comprises a collector region of the bipolar junction transistor.

13. The method of claim 10, wherein the step of forming a pillar in the second silicon carbide layer of silicon carbide comprises etching a portion of the second layer.

14. The method of claim 10, wherein the step of doping a portion of the first layer of silicon carbide comprises high temperature ion implantation.

15. The method of claim 10, further comprising:
   etching a portion of the second layer to form a mesa containing the transistor.

16. The method of claim 15, wherein the step of etching a portion of the second layer of silicon carbide is followed by the steps of:
   forming a dielectric layer on the mesa, and
   anisotropically etching the dielectric layer to reveal contact surfaces.

17. The method of claim 11 or 12, further comprising:
   providing ohmic contacts to the base, emitter and collector regions.

18. The method of claim 10, wherein the second layer of silicon carbide comprises a layer of heavily doped, p-type silicon carbide.

19. A method of fabricating a self-aligned bipolar junction transistor in a semiconductor structure having a first layer of silicon carbide of a first conductivity type, a second layer of silicon carbide of a second conductivity type, opposite to the first conductivity type and epitaxially deposited on the first layer, and a second layer of silicon carbide of the first conductivity type epitaxially deposited on the second layer, the method comprising:
   forming a trench in the second silicon carbide layer, the trench having a bottom wall and opposing side walls;
   depositing a spacer layer having a predetermined thickness on the second semiconductor layer, including the bottom wall and side walls of the trench;
   anisotropically etching the spacer layer from a portion of the bottom wall of the trench between the side walls while at least a portion of the spacer layer remains on the side walls, thereby exposing a portion of the bottom wall of the trench;
   doping a portion of the second layer below the exposed portion of the bottom wall with a dopant of the first conductivity type to create a doped well region in the second layer; and
   removing the spacer layer.

20. A method of fabricating a self-aligned bipolar junction transistor in a semiconductor structure having a first layer of silicon carbide of a first conductivity type, a second layer of silicon carbide of a second conductivity type, opposite to the first conductivity type and epitaxially deposited on the first layer of silicon carbide of a first conductivity type, and a second layer of silicon carbide of the first conductivity type epitaxially deposited on the second layer of silicon carbide of a second conductivity type, the method comprising:
   etching the second layer of silicon carbide of a first conductivity type to form at least one pillar having a top wall and opposing side walls, and a horizontal surface adjacent the pillar;
   depositing a spacer layer having a predetermined thickness on structure, including top wall and side walls of the pillar and the horizontal surface adjacent the pillar;
   anisotropically etching the spacer layer from the horizontal surfaces adjacent the pillar while at least a portion of the spacer layer remains on the side walls of the pillar, thereby exposing the horizontal surface;
   doping a portion of the second layer of silicon carbide of a second conductivity type below the exposed portion of the horizontal surface with a dopant of the first conductivity type to create a doped well region in the second layer; and removing the spacer layer.

* * * * *

UNITED STATES PATENT AND TRADEMARK OFFICE
CERTIFICATE OF CORRECTION

PATENT NO. : 6,218,254 B1
DATED : April 17, 2001
INVENTOR(S) : Singh et al.

It is certified that error appears in the above-identified patent and that said Letters Patent is hereby corrected as shown below:

<u>Title page,</u>
Under "OTHER PUBLICATIONS," please correct the title of the publication as follows:

> *Proceedings of the 28<sup>th</sup> [Internsocietyl]* <u>*Intersociety*</u> *Energy Conversion Engineering Conference,*

Signed and Sealed this

Twelfth Day of March, 2002

Attest:

JAMES E. ROGAN
*Director of the United States Patent and Trademark Office*

*Attesting Officer*